(12) United States Patent
Takatsuka

(10) Patent No.: US 11,670,574 B2
(45) Date of Patent: Jun. 6, 2023

(54) SEMICONDUCTOR DEVICE

(71) Applicant: KIOXIA CORPORATION, Tokyo (JP)

(72) Inventor: Chizuto Takatsuka, Kawasaki Kanagawa (JP)

(73) Assignee: Kioxia Corporation, Tokyo (JP)

( * ) Notice: Subject to any disclaimer, the term of this patent is extended or adjusted under 35 U.S.C. 154(b) by 0 days.

(21) Appl. No.: 17/466,973

(22) Filed: Sep. 3, 2021

(65) Prior Publication Data

US 2021/0398889 A1    Dec. 23, 2021

Related U.S. Application Data

(62) Division of application No. 16/559,224, filed on Sep. 3, 2019, now Pat. No. 11,139,228.

(30) Foreign Application Priority Data

Mar. 14, 2019  (JP) .............................. JP2019-047570

(51) Int. Cl.
| | | |
|---|---|---|
| *H01L 23/498* | (2006.01) | |
| *H01L 21/48* | (2006.01) | |
| *H05K 1/18* | (2006.01) | |
| *H01L 23/00* | (2006.01) | |

(52) U.S. Cl.
CPC ...... *H01L 23/49816* (2013.01); *H01L 21/486* (2013.01); *H01L 21/4853* (2013.01); *H01L 21/4857* (2013.01); *H01L 23/49822* (2013.01); *H01L 23/49827* (2013.01); *H05K 1/181* (2013.01); *H01L 24/48* (2013.01); *H01L 2224/48228* (2013.01)

(58) Field of Classification Search
CPC ........... H01L 23/49816; H01L 21/4853; H01L 21/4857; H01L 21/486; H01L 23/49822; H01L 24/48; H05K 1/181; H05K 1/111
USPC .................. 257/668, 737, 778; 438/123, 124
See application file for complete search history.

(56) References Cited

U.S. PATENT DOCUMENTS

| | | | |
|---|---|---|---|
| 7,164,208 B2 | 1/2007 | Kainou et al. | |
| 9,368,461 B2 | 6/2016 | Albers et al. | |
| 9,748,167 B1* | 8/2017 | Lin ................... | H01L 23/49838 |
| | | | 257/778 |
| 2002/0149118 A1 | 10/2002 | Yamaguchi et al. | |
| 2006/0049519 A1 | 3/2006 | Otsuki | |
| 2009/0108471 A1 | 4/2009 | Fujii | |

FOREIGN PATENT DOCUMENTS

| | | |
|---|---|---|
| JP | H09162240 A | 6/1997 |
| JP | 2017026382 A | 2/2017 |

* cited by examiner

*Primary Examiner* — Thinh T Nguyen
(74) *Attorney, Agent, or Firm* — Kim & Stewart LLP

(57) ABSTRACT

According to one embodiment, a semiconductor device comprises a circuit board and a semiconductor package mounted on the circuit board. The semiconductor package comprises a semiconductor chip, a first connector on a bottom surface of the semiconductor package and electrically connected to the semiconductor chip, and a metal bump coupled to the first connector and electrically connected to a second connector on the circuit board. The first connector has a contact surface facing the second connector. The contact surface has a recessed portion into which the metal bump extends.

19 Claims, 14 Drawing Sheets

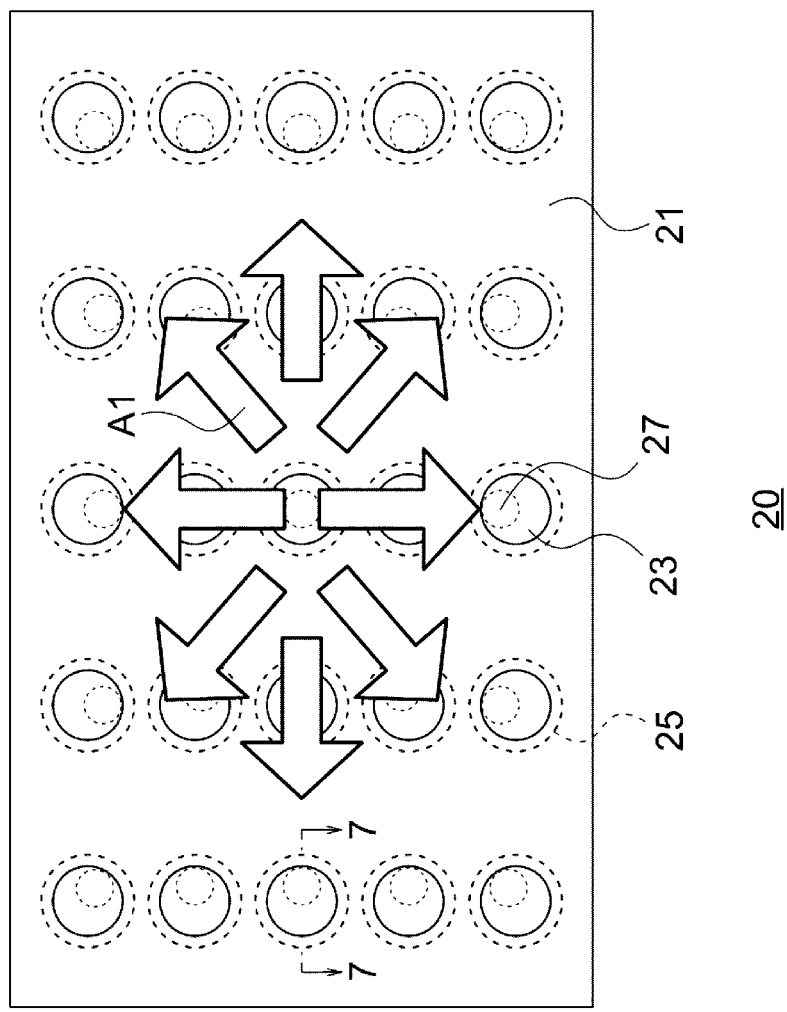

SEMICONDUCTOR DEVICE

CROSS-REFERENCE TO RELATED APPLICATIONS

This application is a division of U.S. patent application Ser. No. 16/559,224, filed on Sep. 3, 2019, which is based upon and claims the benefit of priority from Japanese Patent Application No. 2019-047570, filed Mar. 14, 2019, the entire contents of each of which are incorporated herein by reference.

FIELD

Embodiments described herein relate generally to a semiconductor device.

BACKGROUND

A semiconductor package, such as a ball grid array (BGA), includes solder balls coupled to lands of the semiconductor package. Such a semiconductor package is typically mounted on a printed circuit board, and the solder balls are connected to wiring on the printed circuit board.

The semiconductor package contains a semiconductor chip of relatively low thermal expansion. However, the printed circuit board is mostly made of resin of relatively high thermal expansion. Consequently, while temperature causes the printed circuit board to expand and contract by a relatively large amount, the semiconductor package is mainly affected by expansion and contraction of the semiconductor chip because its expansion and contraction is relatively small comparatively. Thus, when a printed circuit board expands/contracts in accordance with temperature variations, a large stress is applied to solder balls by which the semiconductor package has been mounted to the printed circuit board. This stress is due to the difference between the expansion/contraction of semiconductor package and the printed circuit board. The solder balls may be broken or detached from the lands of the semiconductor package by this stress.

DESCRIPTION OF THE DRAWINGS

FIG. 6 is a plan view of a bottom surface of a semiconductor package according to a second embodiment.

DETAILED DESCRIPTION

Figure 1:
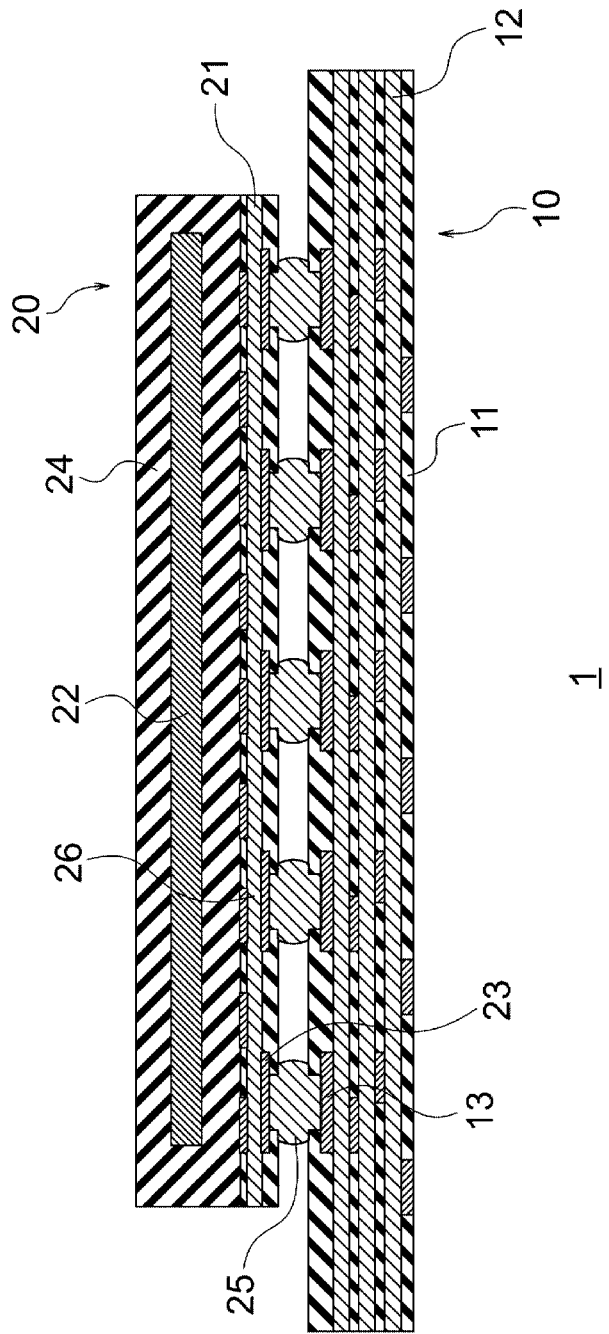
FIG. 1 is a cross-sectional view of a semiconductor device according to a first embodiment.

In general, according to one embodiment, a semiconductor device comprises a circuit board and a semiconductor package mounted on the circuit board. The semiconductor package comprises a semiconductor chip, a first connector on a bottom surface of the semiconductor package and electrically connected to the semiconductor chip, and a metal bump coupled to the first connector and electrically connected to a second connector on the circuit board. The first connector has a contact surface facing the second connector. The contact surface has a recessed portion into which the metal bump extends.

Description will now be made of example embodiments of the present disclosure by reference to the drawings. These example embodiments do not limit the present disclosure. In general, the drawings are schematic and/or conceptual diagrams such that depicted dimensions, relative ratios of the dimensions of parts, do not necessarily coincide with actual devices. In the description and the drawings, substantially the same components previously described or explained are denoted with the same reference numerals and repeated description may be omitted.

While performance of portable electronic terminals, such as smartphones, has been increasing, the demand for size reductions and high-speed operation of packaged semiconductor devices is also increasing. To implement high-speed operation, a semiconductor package typically requires a large number of external terminals for power supply, but at the same time, the semiconductor package generally needs to be reduced in size. In view of these demands, solder bumps are inevitably disposed at the edge portions of the semiconductor package in most cases.

When solder bumps are formed at the edge portions of the semiconductor package, the solder bumps are more likely to come off or be broken during a mounting temperature cycle test (TCT) or operations. The reason is that expansion/contraction between a printed circuit board and the semiconductor package due to temperature changes effectively increases nearer the edge portions of the semiconductor package, and stress applied to the solder bumps at the edge portions likewise increases. Embodiments of the present disclosure can prevent or mitigate this type of stress and prevent or limit the breakage or separation of the lands of the semiconductor package and metal bumps.

First Embodiment

FIG. 1 is a cross-sectional view of a semiconductor device according to a first embodiment. A semiconductor device 1 includes a printed circuit board 10 and a semiconductor package 20. It should be noted that in FIG. 1, recess portions 27, which are illustrated in FIGS. 2 and 3, are not specifically depicted.

The printed circuit board 10 includes resin 11, wiring 12, and lands 13. The resin 11 is, for example, an insulating material, such as glass epoxy resin, and covers the wiring 12. The wiring 12 is made of, for example, conductive metal, such as copper, and is formed in this example as multi-layer wiring in the resin 11. The wiring 12 is electrically connected to the lands 13. The lands 13 are electrically connected to the wiring 12 and also connected to solder bumps 25 of the semiconductor package 20. The lands 13 electrically connect the wiring 12 and the solder bumps 25 to each other. Thus, the printed circuit board 10 is electrically connected to the semiconductor package 20 with the solder bumps 25. The lands 13 may also be referred to as landings, pads, and/or terminals in some contexts.

The semiconductor package 20 includes a resin substrate 21, a semiconductor chip 22, lands 23, mold resin 24, and the solder bumps 25. The resin substrate 21 includes, for example, an insulating material, such as glass epoxy resin and covers wiring 26. The wiring 26 is made of, for example, conductive metal, such as copper, and is formed, in this example, as multi-layer wiring in resin. The wiring 26 is electrically connected to the lands 23. The semiconductor chip 22 is disposed on a first surface of the resin substrate 21 and coated with the mold resin 24. Semiconductor elements (not separately illustrated), such as transistors, diodes, resistors, and capacitors, are formed on the semiconductor chip 22. The semiconductor chip 22 can be electrically connected to the wiring 26 with bonding wires via pads connected to the wiring 26. The lands 23 are disposed on a second surface of the resin substrate 21 that is opposite to the first surface and are coupled to the solder bumps 25. The solder bumps 25 are disposed between the lands 23 and the lands 13 and provide electrical connection therebetween.

Figure 2:
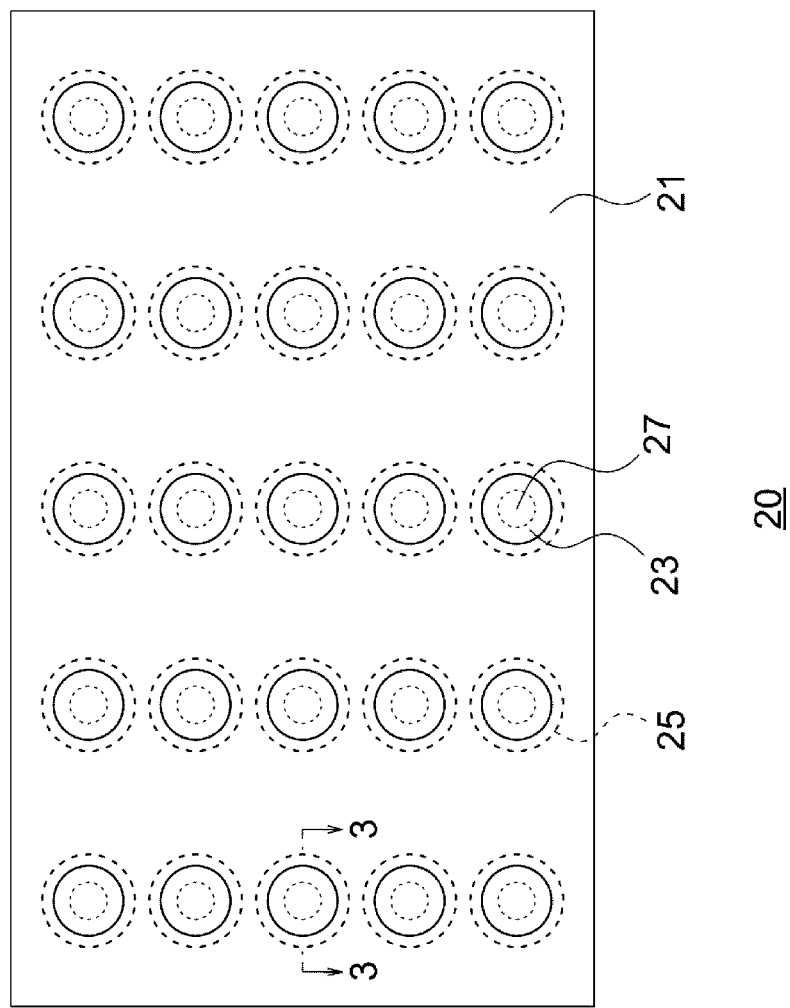
FIG. 2 is a plan view of a bottom surface of a semiconductor package according to a first embodiment.
Figure 3:
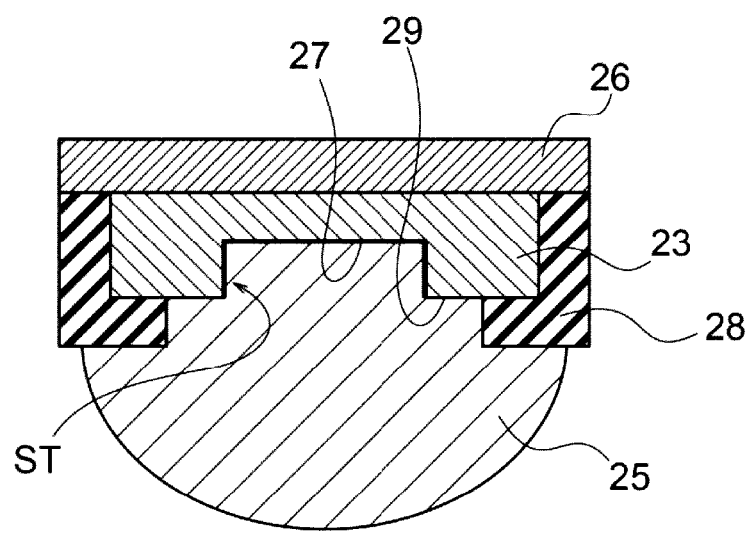
FIG. 3 is a cross-sectional view of apart of a semiconductor package taken along a line 3-3 in FIG. 2.

FIG. 2 is a plan view of a bottom surface of the semiconductor package 20 according to the first embodiment. The bottom surface of the semiconductor package 20 faces the printed circuit board 10, and the lands 23 and the solder bumps 25 are disposed on the bottom surface. In FIG. 2, the solder bumps 25 are indicated with dashed lines, and the lands 23 and the recess portions 27 beneath the solder bumps 25 are illustrated.

The semiconductor package 20 includes the lands 23 in a matrix two-dimensionally arranged on the bottom surface. The solder bumps 25 are each in contact with one of the lands 23. A substantially central portion of a contact surface of each of the lands 23 has a recess portion 27, also referred to as a countersink 27 in some contexts. As viewed from the bottom surface of the semiconductor package 20, each recess portion 27 has a substantially similar shape as the corresponding land 23 and is inside of the land 23. For example, the recess portion 27 has a substantially circular shape similar to the shape of the land 23. In other non-limiting examples, the shapes of the land 23 and the recess portion 27, as viewed from the bottom surface of the semiconductor package 20, may be a substantially elliptic shape, a substantially polygonal shape, and a substantially semicircular shape.

FIG. 3 is a cross-sectional view of part of the semiconductor package 20, taken along the line 3-3 in FIG. 2. Resin material 28, which is a portion of the resin substrate 21, covers the bottom surface of the semiconductor package 20 except for the lands 23. Examples of the resin material 28 include solder resist. The lands 23 are not fully covered with the resin material 28 and the solder bumps 25 are in contact with the exposed portion of the lands 23. Additionally, each of the lands 23 includes a recess portion 27, which defines part of a contact surface between the land 23 and the solder bump 25. The contact surface between the land 23 and the solder bump 25 is formed by the recess portion 27 and a peripheral portion 29 (of the lands 23) surrounding the recess portion 27. The recess portion 27 is recessed from the peripheral portion 29 toward the resin substrate 21 side, and a stepped portion ST is formed between the recess portion 27 and the peripheral portion 29. The land 23 is in contact with the solder bump 25 at the recess portion 27 and the peripheral portion 29. The solder bump 25 is in contact with a surface of the peripheral portion 29, an inner side surface of the recess portion 27, and a bottom surface of the recess portion 27. The solder bump 25 is thus considered to be in contact with the stepped portion ST.

With this configuration, the land 23 and the solder bump 25 have a contact area that is larger than would be the case if the land 23 was simply flat. Moreover, the stepped portion ST of the land 23 serves as an anchor point for the solder bump 25, which is considered to increase coupling strength between the solder bumps 25 and the lands 23 and prevent the stresses applied to the solder bumps 25 from making the solder bumps 25 break or separate from the lands 23.

Figure 4A:
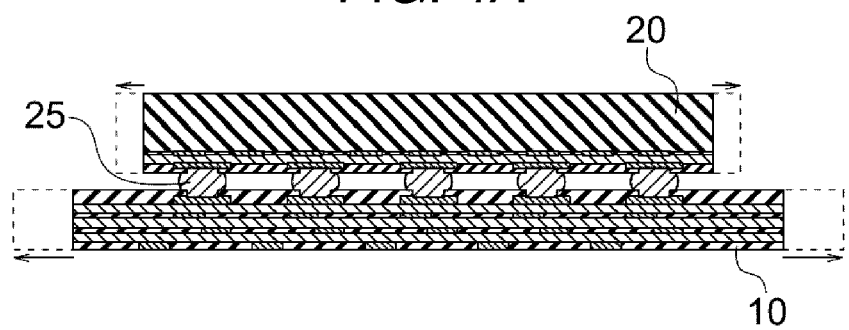
FIGS. 4A and 4B are conceptual diagrams for explaining aspects of expansion/contraction with temperature of a printed circuit board and a semiconductor package.

FIGS. 4A to 5B are conceptual diagrams for illustrating aspects of expansion/contraction of the printed circuit board 10 and the semiconductor package 20 in accordance with temperature. FIGS. 4A and 4B illustrate the printed circuit board 10 and the semiconductor package 20 when the temperature is increased.

Figure 4B:
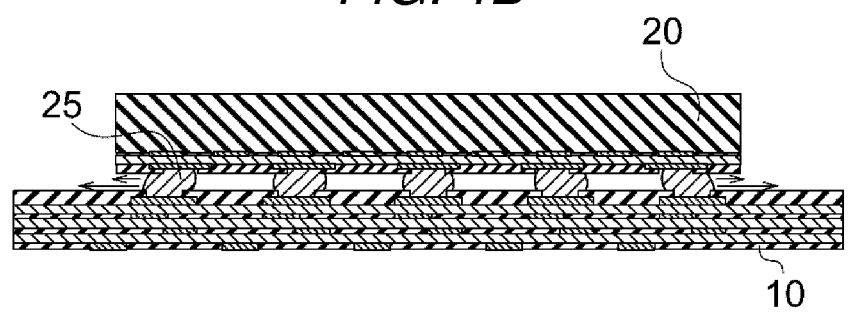

When a temperature of the semiconductor device 1 is raised to, for example, +125° C., the printed circuit board 10 and the semiconductor package 20 expand as indicated with the arrows and dashed lines in FIG. 4A. At this time, the semiconductor package 20 containing the semiconductor chip 22 generally expands by a smaller degree than the printed circuit board 10 due to differences in materials or the like. Consequently, as illustrated in FIG. 4B, stress is applied to the solder bumps 25. However, according to this embodiment, the lands 23 each include a recess portion 27 to prevent the solder bumps 25 from coming off or being broken from the lands 23.

Figure 5A:
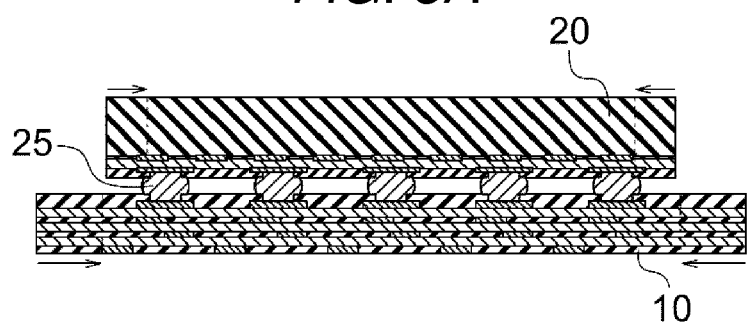
FIGS. 5A and 5B are conceptual diagrams for explaining aspects of expansion/contraction with temperature of a printed circuit board and a semiconductor package.
Figure 5B:
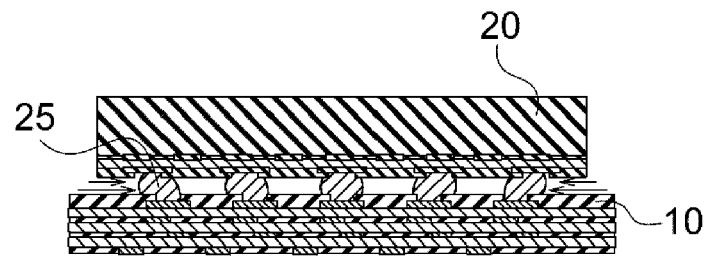

FIGS. 5A and 5B illustrate a state of the printed circuit board 10 and the semiconductor package 20 when the temperature is decreased.

When the temperature of the semiconductor device 1 is lowered to, for example, −25° C., the printed circuit board 10 and the semiconductor package 20 contract as indicated with the arrows and dashed lines in FIG. 5A. At this time, the semiconductor package 20 containing the semiconductor chip 22 contracts by a smaller degree than the printed circuit board 10 due to differences in materials or the like. Consequently, as illustrated in FIG. 5B, stress is applied to the solder bumps 25. However, according to this embodiment, the lands 23 each include a recess portions 27 which helps prevent the solder bumps 25 from coming off or being broken from the lands 23.

It should be noted that although in this first embodiment, the recess portions 27 have been formed in all of the lands 23; however, in other examples, the recess portions 27 can be formed in only some of the lands 23. For example, the recess portions 27 may be formed in only those lands 23 on an outer peripheral (edge) portion of the bottom surface of the semiconductor package 20 since it is these outer lands 23 to which a relatively larger stress is applied. In other examples, the recess portions 27 may be formed in only the lands 23 at the four corners of the bottom surface of the semiconductor package 20. In this case, the recess portions 27 are not formed in the lands 23 in the central portion of the bottom surface of the semiconductor package 20.

Second Embodiment

FIG. 6 is a plan view of a bottom surface of the semiconductor package 20 according to a second embodiment. In the second embodiment, the recess portions 27 are deviated from the center of the land 23 in a direction opposite to the arrows A1. That is, the recess portions 27 are offset from the center of the respective lands 23 in a direction toward the center of the semiconductor package 20. In FIG. 6, for the central land 23, no offset of the recess portion 27 is depicted. The arrows A1 indicate directions of stress that the solder bumps 25 receive from the printed circuit board 10 when temperature is increased. The recess portions 27 are offset in the direction reverse to the stress direction A1. The recess portion 27 is thus deviated in a direction reverse to tensile stress of the solder bump 25. This enhances coupling strength between the solder bumps 25 and the lands 23 to increase resistance of the solder bumps 25 to tensile stress.

Figure 7:
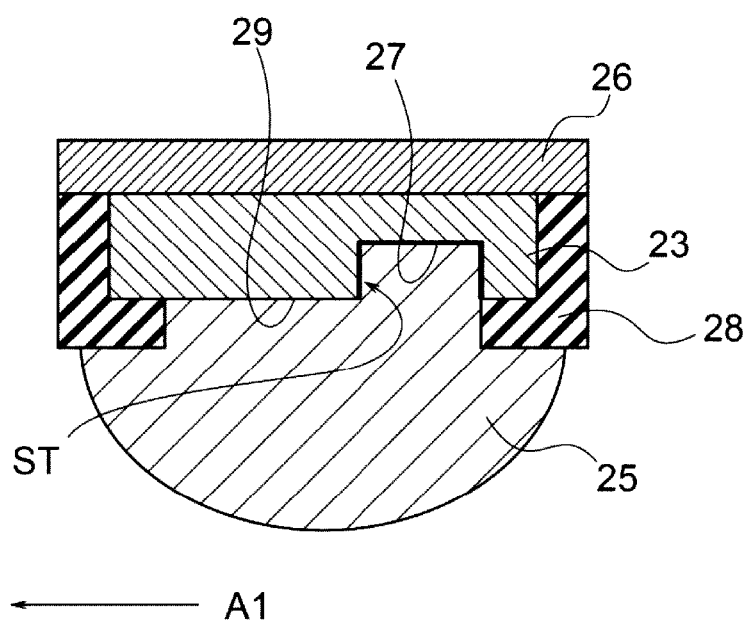
FIG. 7 is a cross-sectional view of apart of a semiconductor package taken along the line 7-7 in FIG. 6.

FIG. 7 is a cross-sectional view of part of the semiconductor package, taken along the line 7-7 in FIG. 6. The recess portion 27 is offset in a direction reverse to the stress direction A1 relative to the center of the land 23. Accordingly, the peripheral portion 29 of the land 23 is on primarily on the side of the recess portion 27 in the stress direction A1. This enables the second embodiment to produce substantially the same effect as the first embodiment. This also enhances coupling strength between the solder bumps 25 and the lands 23.

(First Modification)

Figure 8:
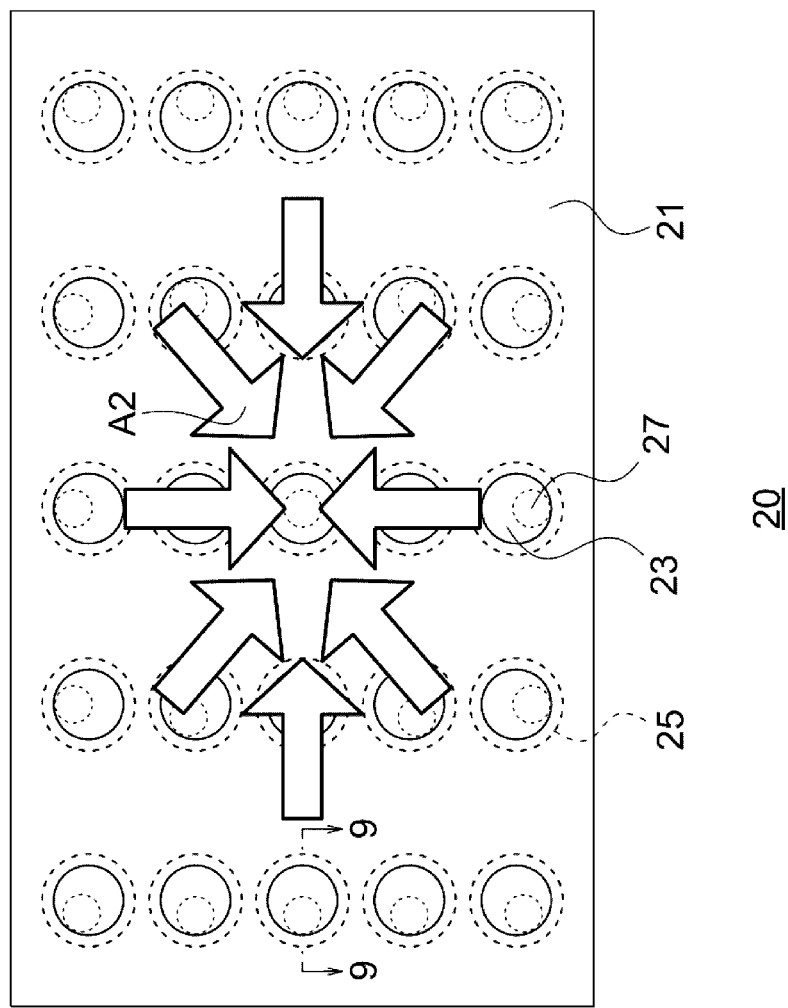
FIG. 8 is a plan view of a bottom surface of a semiconductor package according to a first modification.

FIG. 8 is a plan view of a bottom surface of a semiconductor package 20 according to a first modification. In this modification, each of the recess portions 27 is offset from the center of the respective land 23 in a direction reverse to the arrows A2. The arrows A2 indicate directions of stress that the solder bumps 25 receive from the printed circuit board 10 when temperature is decreased. In the lands 23, the recess portion 27 is offset from center in a direction opposite to the stress direction A2. That is, the recess portion 27 is offset from center of the land 23 in a direction reverse to contraction stress of the solder bump 25. This further enhances coupling strength between the solder bumps 25 and the lands 23 to increase resistance of the solder bumps 25 to contraction stress.

Figure 9:
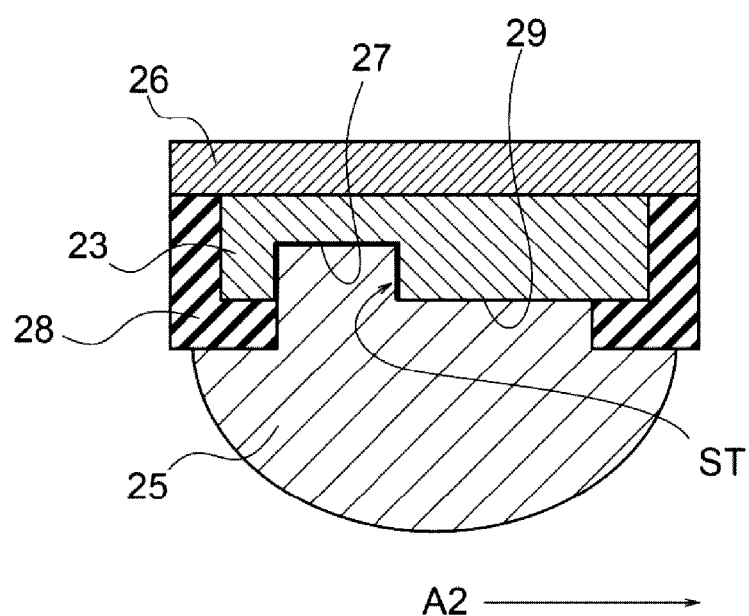
FIG. 9 is a cross-sectional view of apart of a semiconductor package, taken along the line 9-9 in FIG. 8.

FIG. 9 is a cross-sectional view of part of the semiconductor package 20, taken along the line 9-9 in FIG. 8. The recess portion 27 is offset from the center of the land 23 in a direction reverse to the stress direction A2. The peripheral portion 29 of the land 23 is primarily disposed in the stress direction A2 of the recess portion 27.

Third Embodiment

Figure 10:
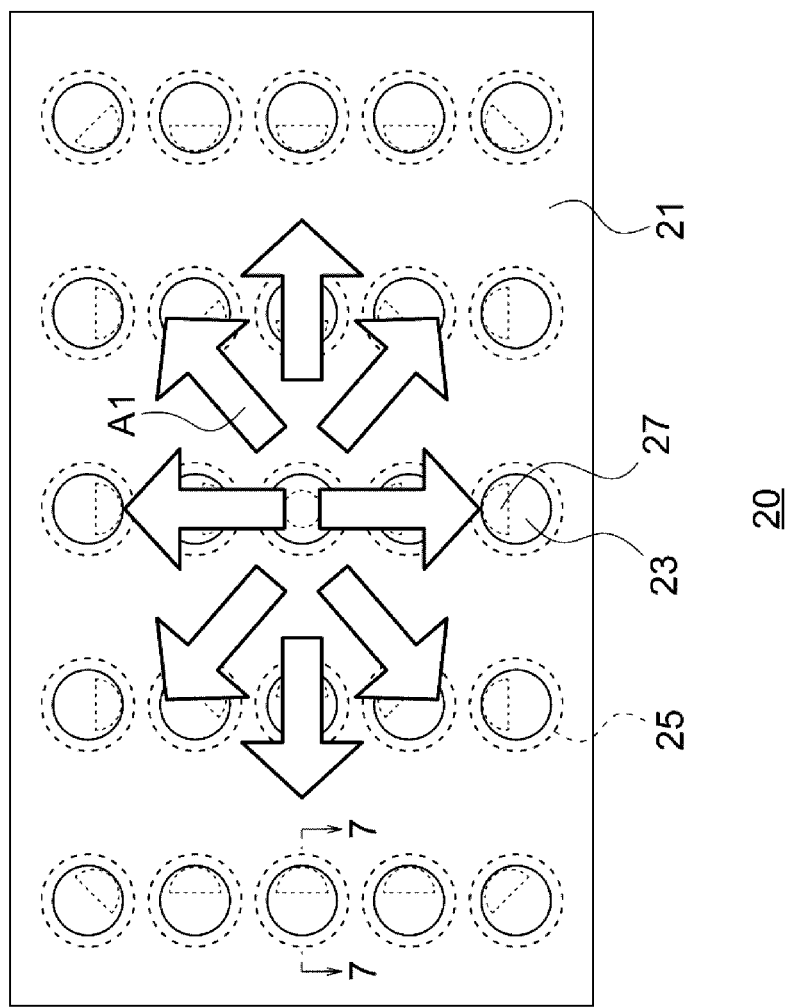
FIG. 10 is a plan view of a bottom surface of a semiconductor package according to a third embodiment.

FIG. 10 is a plan view of a bottom surface of a semiconductor package 20 according to a third embodiment. The third embodiment differs from the second embodiment in that a plan-view shape of each of the recess portions 27 is substantially semicircular. The rest of the configuration of the third embodiment may be considered to be substantially the same as the corresponding configuration of the second embodiment, with the semicircular recess portions being positioned according to expected stress directions A1. It should be noted that a cross-sectional view taken along the line 7-7 in FIG. 10 appears substantially the same as FIG. 7.

The semiconductor package 20 with semicircular recess portions 27 positioned as depicted in FIG. 10 produces substantially the same effect as the second embodiment.

(Second Modification)

Figure 11:
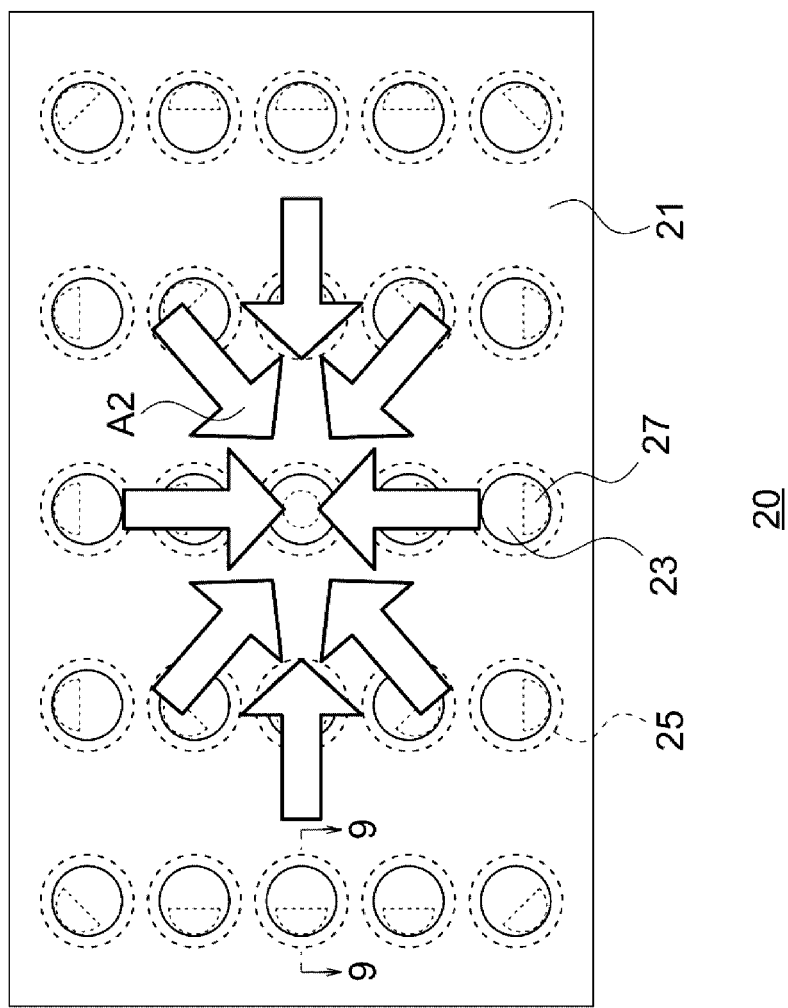
FIG. 11 is a plan view of a bottom surface of a semiconductor package according to a second modification.

FIG. 11 is a plan view of a bottom surface of the semiconductor package 20 according to a second modification. The second modification differs from the above-described first modification in that a plan-view shape of each of the recess portions 27 is substantially semicircular. The rest of the configuration of the second modification may be considered substantially the same as the corresponding configuration of the first modification. It should be noted that a cross-sectional view taken along the line 9-9 in FIG. 11 appears substantially the same as FIG. 9.

The semiconductor package 20 with semicircular recess portions 27 positioned as depicted in FIG. 11 produces substantially the same effect as the first modification.

It should be noted that after exposing the lands 23 from the resin material 28, the recess portions 27 may be formed by processing exposed surfaces of the lands 23 by lithography and etching techniques. Lithography and etching techniques enable the recess portions 27 to have desired shapes and sizes, such as depicted in the various example embodiments of the present disclosure. In some examples, the recess portions 27 may be selectively formed in only some of the lands 23 rather than every one of the lands 23.

Fourth Embodiment

Figure 12:
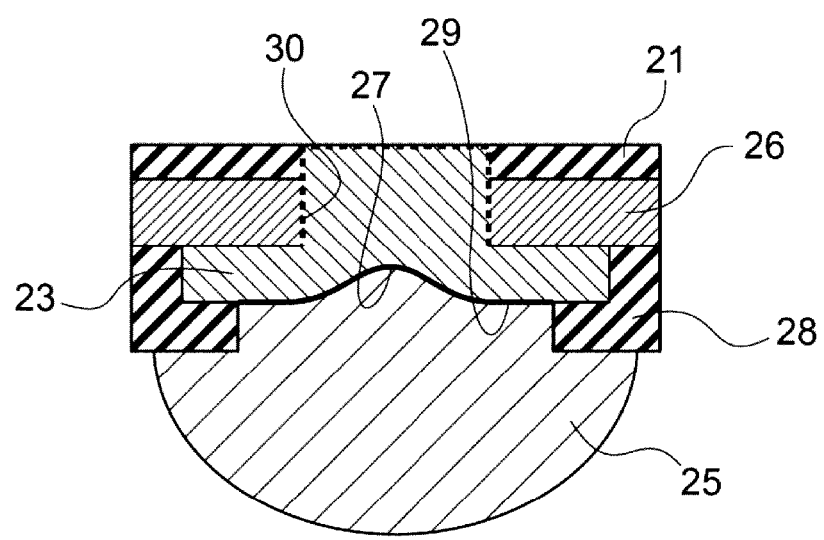
FIG. 12 is a cross-sectional view of a part of a semiconductor package according to a fourth embodiment.

FIG. 12 is a cross-sectional view of part of the semiconductor package 20 according to a fourth embodiment. The cross-sectional view of FIG. 12 corresponds to a cross-sectional view of the semiconductor package 20, taken along the line 3-3 in FIG. 2.

The resin substrate 21 according to the fourth embodiment includes through vias 30 at portions corresponding to the position of the lands 23. Each of the through vias 30 extends through the resin substrate 21 from the top surface to the bottom surface to electrically connect wiring at the top surface and wiring at the bottom surface of the resin substrate 21. The through vias 30 may be formed for all of the lands 23 or may be formed for only some of the lands 23.

Metal material filled in holes formed for the through vias 30 may be substantially the same material (e.g., copper) as the lands 23. When the metal material is filled in each of the holes for the through vias 30, the metal material thus filled is normally left with a recessed portion (depression) at a center position of the hole. In the fourth embodiment, this depression is used as the recess portion 27. That is, without using lithography and etching techniques, the recess portions 27 in this fourth embodiment are formed on surfaces of the through vias 30. This formation of a recess portion 27 on the surface of the through vias 30 provides an anchoring effect to the solder bumps 25.

The through vias 30 may be connected to the wiring of the semiconductor chip 22 and the printed circuit board 10. Additionally, he through vias 30 or a subset thereof may be dummy vias without electrical connection to active wiring. In this context, dummy vias are electrically floating or grounded vias not in use for any device operations. When the through vias 30 are dummy vias, these through vias 30 can be formed in outer peripheral portions or four corners of the bottom surface of the resin substrate 21. In such a case, without adopting lithography and etching techniques, the recess portions 27 may be formed on the through vias 30 in the peripheral edge portions or four corners.

Lands 23 formed with through vias 30 and lands 23 without through vias 30 (e.g., lands 23 as in the first to third embodiments described above) may coexist in the same device. In a similar manner to the lands 23 in the first to third embodiments, the lands 23 as non-through connectors are disposed on the bottom surface of the resin substrate 21 without extending through the resin substrate 21, and are connected to the wiring of the resin substrate 21. In this case, because the through vias 30 include the recess portions 27, the other (non-through connector) lands 23 may simply be flat. Alternatively, recess portions 27 may be formed in various non-through connector lands 23 using lithography and etching techniques as described above. When the recess portions 27 are manufactured in lands 23 in addition to those lands 23 with the through vias 30, the effect of anchoring the solder bumps 25 can be enhanced.

When the through vias 30 are dummy vias and formed in outer peripheral portions and corners of the bottom surface of the resin substrate 21, the lands 23 which are non-through connectors can be disposed in a central portion of the bottom surface of the resin substrate 21. The lands 23 in the central portion may or may not include the recess portions 27 formed by lithography and etching according to considerations of manufacturing costs and required device performance.

Figure 13A:
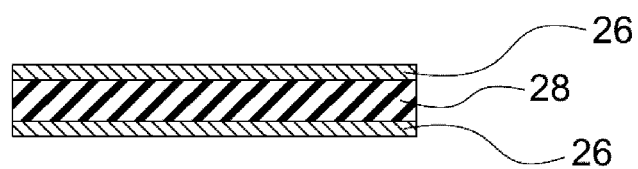
FIGS. 13A, 13B, and 13C are cross-sectional views of a resin substrate according to a fourth embodiment, illustrating aspects of a method of forming a resin substrate.

FIGS. 13A to 14C are cross-sectional views of the resin substrate 21 according to the fourth embodiment, illustrating an example of a method of forming the resin substrate 21. It should be noted that FIGS. 13A to 13C illustrate an example in which wiring is disposed on the top surface and the bottom surface of the resin substrate 21. However, in some examples, the wiring may also be disposed inside of the resin substrate 21.

First, as illustrated in FIG. 13A, material of the wiring 26 is deposited on a top surface and a bottom surface of the resin material 28. Examples of the resin material 28 include solder resist. The wiring 26 is made of a conductive material, such as copper.

Figure 13B:
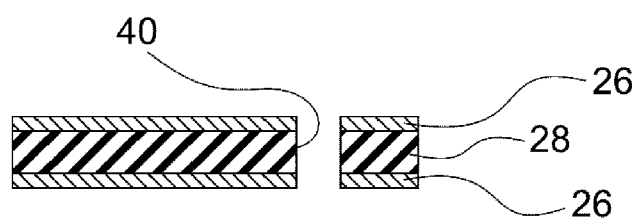

Next, as illustrated in FIG. 13B, a through via hole 40 is formed. The through via hole 40 may be formed, for example, by drilling the resin material 28 from the top surface to the bottom surface. Alternatively, the through via hole 40 may be formed using lithography and etching techniques.

Figure 13C:
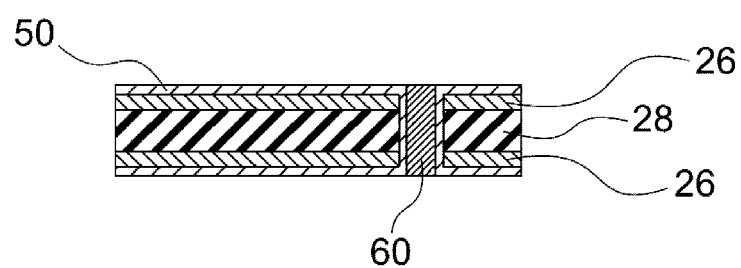

Next, as illustrated in FIG. 13C, metal film 50 is formed on surfaces of the wiring 26 and inner walls of the through via hole 40 by electrolytic plating or electroless plating. Thus, the wiring 26 on the top surface and the bottom surface of the resin material 28 is electrically connected with the through via hole 40.

A metal material 60 is filled in the through via hole 40 while other regions are masked with photoresist of the like patterned with lithography to leave the via hole 40 exposed. Examples of the metal material 60 include conductive metal such as copper. Though not specifically depicted in FIG. 14C, the recess portions 27 are formed in a top surface and a bottom surface of the metal material 60 as described with reference to FIG. 12. In general, no additional processing is required to form the recess portions 27 in the surfaces of the plated metal material 60.

Figure 14A:
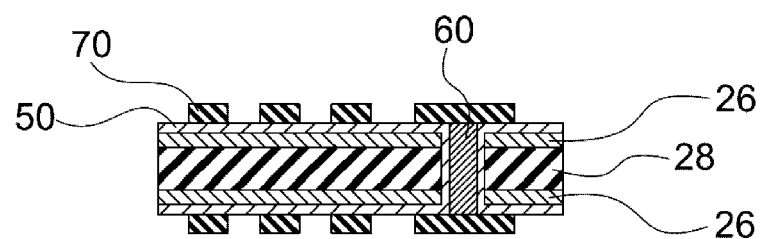
FIGS. 14A, 14B, and 14C are cross-sectional views of a resin substrate, illustrating aspects of a method of forming a resin substrate.

Next, as illustrated in FIG. 14A, photoresist 70 is patterned using lithography. The photoresist 70 is patterned to cover the regions where the through vias 30, the lands 23, and bonding pads) are to be formed.

Figure 14B:
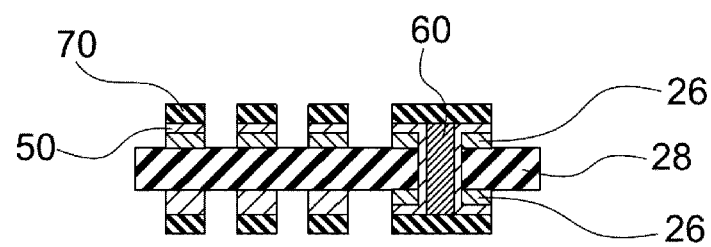

Next, as illustrated in FIG. 14B, using the patterned photoresist 70 as a mask, portions of the metal film 50 and the wiring 26 are etched. Thus, the metal film 50, the wiring 26, and the metal material 60 is left in the regions where the through vias 30, the lands 23, and the bonding pads are to be formed.

Figure 14C:
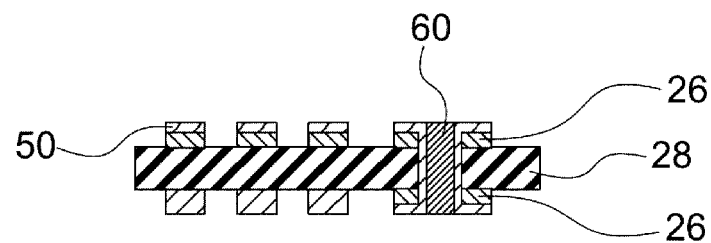

Next, as illustrated in FIG. 14C, the photoresist 70 is removed.

Figure 15:
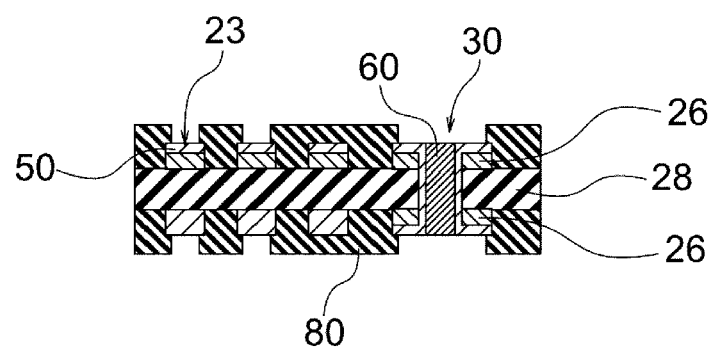
FIG. 15 is a cross-sectional view of a resin substrate, illustrating aspects of method of forming a resin substrate.

Next, as illustrated in FIG. 15, regions other than where the through vias 30, the lands 23, and the bonding pads are located are coated with solder resist 80. The solder resist 80 does not cover the through vias 30, the lands 23, and the bonding pads but covers the rest. Next, as illustrated in FIG. 12, the solder bumps 25 are respectively formed on the through vias 30 and the lands 23. Thus, the resin substrate 21 according to the fourth embodiment is formed.

The semiconductor chip 22 is mounted on the resin substrate 21, and then the semiconductor chip 22 and the bonding pads are connected to each other with metal bonding wire or the like. The semiconductor chip 22 disposed on the resin substrate 21 along with any bonding wires are encapsulated within the mold resin 24. This completes the semiconductor package 20. The semiconductor package 20 can then be mounted on the printed circuit board 10, and the solder bumps 25 are bonded to the lands 13 of the printed circuit board 10 by heat treatment.

While certain embodiments have been described, these embodiments have been presented by way of example only, and are not intended to limit the scope of the present disclosure. Indeed, the novel embodiments described herein may be embodied in a variety of other forms; furthermore, various omissions, substitutions and changes in the form of the embodiments described herein may be made without departing from the spirit of the present disclosure. The accompanying claims and their equivalents are intended to cover such forms or modifications as would fall within the scope and spirit of the present disclosure.

What is claimed is:

1. A semiconductor device, comprising:
a circuit board; and
a semiconductor package mounted on the circuit board, the semiconductor package comprising:
a semiconductor chip;
a first connector on a bottom surface of the semiconductor package and electrically connected to the semiconductor chip; and
a metal bump coupled to the first connector and electrically connected to a second connector on the circuit board, wherein
the first connector has a contact surface facing the second connector and having a recessed portion into which the metal bump extends, and
the recess portion is offset in a first direction from a center of the first connector.

2. The semiconductor device according to claim 1, wherein the first direction is towards a central portion of the bottom surface of the semiconductor package.

3. The semiconductor device according to claim 1, wherein the first direction is away from a central portion of the bottom surface of the semiconductor package.

4. The semiconductor device according to claim 1, wherein the first connector and the recess portion have corresponding planar shapes in a plane parallel to the bottom surface.

5. The semiconductor device according to claim 1, wherein the first connector and the recess portion have corresponding planar shapes in a plane parallel to the bottom surface.

6. The semiconductor device according to claim 1, wherein the recess portion has a planar shape in a plane parallel to the bottom surface that is one of a substantially circular shape, a substantially elliptic shape, or a substantially polygonal shape.

7. The semiconductor device according to claim 1, wherein the first connector is a through connector extending from the bottom surface of the semiconductor package to a top surface of a resin substrate of the semiconductor package.

8. The semiconductor device according to claim 7, wherein the recess portion is a depression on a bottom surface of the through connector.

9. The semiconductor device according to claim 7, wherein the first connector does not extend through the resin substrate of the semiconductor package.

10. A semiconductor device, comprising:
a circuit board having a plurality of pads on a first surface side; and
a semiconductor package mounted on the plurality of pads on the first surface side of the circuit board, the semiconductor package comprising:
a semiconductor chip;
a plurality of first connectors on a bottom surface of the semiconductor package and electrically connected to the semiconductor chip; and
a plurality of metal bumps between each first connector and a corresponding pad of the plurality of pads on the first surface side of the circuit board, wherein
each first connector has a contact surface that is facing the corresponding pad, each contact surface having a recessed portion in which the metal bump is received, and
the recess portion of at least one first connector is offset in a first direction from a center of the at least one first connector.

11. The semiconductor device according to claim 10, wherein each recess portion has a planar shape in a plane parallel to the bottom surface that is one of a substantially circular shape, a substantially elliptic shape, or a substantially polygonal shape.

12. The semiconductor device according to claim 10, wherein first connectors of the plurality of first connectors outside of a central portion of the bottom surface of the semiconductor package each have recess portions that are offset in the first direction from the center of the respective first connector.

13. The semiconductor device according to claim 12, wherein the first direction is towards the central portion of the bottom surface of the semiconductor package.

14. The semiconductor device according to claim 12, wherein the first direction is away from the central portion of the bottom surface of the semiconductor package.

15. The semiconductor device according to claim 10, wherein at least one first connector in the plurality of first connectors is a through connector extending from the bottom surface of the semiconductor package to a top surface of a resin substrate of the semiconductor package.

16. The semiconductor device according to claim 15, wherein the recess portion of the at least one first connector is a depression on a bottom surface of the through connector.

17. A semiconductor device, comprising:
a circuit board having a plurality of pads on a first surface, the plurality of pads being in an array having a central region and a peripheral region surrounding the central region in a plane of the first surface;
a semiconductor package mounted on the plurality of pads on the first surface of the circuit board with a plurality of solder balls on the plurality of pads, the semiconductor package comprising:
a semiconductor chip;
a plurality of connectors on a bottom surface of the semiconductor package, electrically connected to the semiconductor chip, and positioned to overlap the plurality of pads, wherein
each connector has a contact surface that is facing a corresponding pad of the plurality of pads,
each contact surface has a recessed portion in which a solder ball is received, and
connectors corresponding to pads in the peripheral region have recessed portions which are offset in a first direction from a center of the connector.

18. The semiconductor device according to claim 17, wherein the first direction is towards the central region.

19. The semiconductor device according to claim 17, wherein the first direction is away from the central region.

* * * * *